United States Patent [19]

Toda et al.

[11] Patent Number: 5,044,071
[45] Date of Patent: Sep. 3, 1991

[54] MANUFACTURING METHOD FOR TAPING ELECTRONIC COMPONENT

[75] Inventors: Yasuhiko Toda; Moriyuki Hatta; Masao Okamoto; Katsuyoshi Matsui, all of Nagaokakyo, Japan

[73] Assignee: Murata Manufacturing Co., Ltd., Nagaokakyo, Japan

[21] Appl. No.: 504,135

[22] Filed: Apr. 3, 1990

[30] Foreign Application Priority Data

Apr. 3, 1989 [JP] Japan .................................. 1-84563

[51] Int. Cl.$^5$ .......................................... H01R 43/00
[52] U.S. Cl. ................................... 29/827; 179/52.2; 357/69; 437/206
[58] Field of Search ................ 29/827; 174/52.2, 52.4; 437/206; 357/69, 70

[56] References Cited

U.S. PATENT DOCUMENTS

| | | | |
|---|---|---|---|
| 4,331,740 | 5/1982 | Burns | 29/827 X |
| 4,466,183 | 8/1984 | Burns | 29/827 |
| 4,653,174 | 3/1987 | Gilder, Jr. et al. | 29/827 X |
| 4,778,564 | 10/1988 | Emamjomeh et al. | 29/827 X |
| 4,812,421 | 3/1989 | Jung et al. | 29/827 X |

Primary Examiner—Carl J. Arbes
Attorney, Agent, or Firm—Wenderoth, Lind & Ponack

[57] ABSTRACT

A method of manufacturing a tape of finished electronic components in which the components project laterally from the tape and are supported on the tape by long leads of the electronic components. An electronic component set is prepared constituted by a plurality of electronic component bodies, a lead terminal member having an elongated connecting member and a plurality of groups of laterally extending lead terminals spaced at intervals along the connecting member, one group per component body. All but one of the lead terminals in each group are cut at a position to separate the lead terminals other than the one lead terminal from the connecting member. The electrical properties of the electronic bodies are then measured through the respective terminals, and then the one uncut lead terminal is cut to separate semi-finished electronic components. The free ends of the lead terminals of the semi-finished electronic components are attached to the tape, and then only some of the lead terminals of the respective semi-finished electronic components are cut between the tape and the electronic component bodies for forming short lead terminals to produce finished electronic components having some short lead terminals, with the finished electronic components supported along the tape by the remaining lead terminals which, when they are cut to separate the electronic components from the tape, become long lead terminals of the finished electronic components.

1 Claim, 3 Drawing Sheets

5,044,071

MANUFACTURING METHOD FOR TAPING ELECTRONIC COMPONENT

FIELD OF THE INVENTION

This invention relates to a manufacturing method for manufacturing a tape with electronic components thereon, and more particularly to a manufacturing method for such a tape in which a number of electronic components having long lead terminals and short lead terminals are secured at appointed intervals to a long tape by means of said long lead terminals fixed thereto.

PRIOR ART

Conventionally, such a tape of electronic components is used in which a number of electronic components are secured at appointed intervals to a long tape by means of the lead terminals thereof in such a manner that the electronic components having a plurality of lead terminals can be automatically inserted into a printed-wiring substrate by an automatic insertion machine.

This kind of tape of electronic components has conventionally been manufactured according to the explanatory drawing of a process shown in FIGS. 6-9 and the method explained below.

First, electronic component 11 is prepared as shown in FIG. 6. The set 11 is so constructed that a plurality of electronic component bodies 15 are fixed to lead terminal member 14 by integrally forming a number of lead terminals 13 in a row in the direction of length of a long connecting member 12 made of metal plate along one side edge thereof.

In other words, in lead terminal member 14, out of a number of lead terminals 13, groups are formed which are constituted by a plurality of adjacent lead terminals 13 and an electronic component body 15 is fixed to each group at the ends of the terminals 13.

The body 15 can be, for example, a hybrid integrated circuit, an R network and the like comprising an insulating substrate having a wiring pattern formed thereon, and after being fixed to lead terminals, an insulating coating is applied as the occasion demands.

Next, in electronic component set 11 having such a construction, lead terminals 13, except an appointed terminal 13a, having respective electronic component bodies 15 fixed thereto are cut at positions shown by dotted lines A—A' and B—B' near connecting member 12. By so doing, the electronic component sets 11' are obtained each having a plurality of lead terminals 13b which have been separated from connecting member 12 as shown in FIG. 7. The lead terminal 13a still linked to connecting member 12 extends out from, for example, a common lead in the wiring pattern.

In these electronic component sets 11', electric properties of the electronic component body 15 can be measured between lead terminal 13a linked to connecting member 12 and respective lead terminals 13b separated from the member 12.

Subsequently, the lead terminal 13a and some cf lead terminals 13b are cut at a position shown by dotted line H—H' near electronic component body 15 in such a manner that the lead terminals thus cut may have, for example, pointed ends. By so doing, a number of electronic components 16 separate from connecting member 12 are obtained, each having long lead terminals 13b and shorter ones 13c as shown in FIG. 8.

Then, as shown in FIG. 9, electronic components 16 are secured to tape 17 at a desired pitch by means of longer lead terminals 13b fixed to long tape 17 at end portions thereof over which adhesive tape 18 is applied, to thereby obtain a tape of electronic components 19. Numeral 20 designates perforations formed at a desired pitch in tape 17 and adhesive tape 18.

The conventional tape of electronic components 19 manufactured in the way described above is fed into an automatic insertion machine by feed pins engaged with perforations 20 formed in tape 17 and adhesive tape 18. The lead terminals 13b fixed to tape 17 of the tape of electronic components 19 having been fed to the automatic insertion machine are cut at a position shown by dotted line I—I' near tape 17 in FIG. 9 in such a way that lead terminals thus cut may have, for example, pointed ends, whereby electronic component 16 is separated from tape 17.

The lead terminals of electronic component 16 thus separated are inserted by the next movement of the automatic insertion machine into feedthrough holes in a printed-wiring substrate (not shown). As shown in FIG. 9, lead terminals 13b are cut along dotted line I—I' so that electronic component 16 has long lead terminals 13b and shorter terminals 13c. As a result, when terminals 13b and 13c are inserted into feedthrough holes in a printed-wiring substrate, long lead terminals 13b are first inserted, followed by shorter terminals 13c, to thereby facilitate insertion of lead terminals compared with the case where all the lead terminals are of the same length, into the printed-wiring substrate.

The printing-wiring substrate having the electronic component 16 inserted therein is dipped into molten solder whereby lead terminals 13b and 13c are soldered to appointed wiring patterns. But prior to soldering, longer lead terminals 13b are bent by bending fingers of the automatic insertion machine on the back side of the printed-wiring substrate to thereby temporarily secure electronic component 16 to the wiring substrate.

In the tape of electronic components 19 shown in FIG. 9, electronic component 16 thereof is fixed to the printed-wiring substrate by means of movement of the automatic insertion machine described above. In order to fix an electronic component different from the component 16 having a different number of lead terminals to a wiring substrate by the same automatic insertion machine, it is necessary to keep constant the number of longer lead terminals 13b fixed to tape 17 shown in FIG. 9. For that purpose, it becomes necessary for electronic component 16 to be provided with two kinds of lead terminals: long lead terminals 13b to be fixed to the tape and shorter ones 13c not fixed thereto as shown in FIGS. 8 and 9.

PROBLEM SOLVED BY THE INVENTION

In the conventional method of manufacturing a tape of electronic components 19 described above, the electric properties of each electronic component body 15 are measured when the electronic component set 11' is as shown in FIG. 7 and thereafter, the set 11' is transferred to the next process. On this occasion, by utilizing perforations h formed in connecting member 12 or projecting plates (not shown) likewise formed on the member 12 after separation of lead terminals 13 therefrom, the electronic component set 11' is transferred intermittently.

Hence, a problem has occurred, in that in transferring an electronic component set 11', electronic component body 15 is pressed in the direction of the tape length by external force due to being touched by other members to thereby cause lead terminal 13a linked to connecting member 12 to bend, with the result that the position of electronic component body 15 is shifted in the same plane from the regular position thereof with the bent portion of terminal 13a as a supporting point.

When electronic component body 15 is shifted from the regular position in this way, the cutting position for cutting the lead terminals shown by dotted line H—H' in FIG. 7 is also shifted, while the position of a cutter for cutting the lead terminals remains unchanged. Thus, another problem is caused in that there is an error in the length of lead terminals 13c as compared with those in FIG. 8 after lead terminals 13a and 13b have been cut using a cutter, whereby the desired value is not obtained, causing the rate of production of inferior quality electronic components 16 to be raised.

OBJECT AND BRIEF SUMMARY OF THE INVENTION

Accordingly, the object of the present invention is to provide a method for manufacturing a tape of electronic components which overcomes the problems described above, wherein cutting and formation of shorter lead terminals is conducted after securing lead terminals to a tape to thereby increase the precision of the cutting process for the lead terminals so that the rate of production of inferior quality electronic components can be reduced.

In order to solve the above-described problems, the present invention has provided a method of manufacturing composed of the following steps (a)-(f) in the recited order.

(a) Preparing an electronic component set constituted by a plurality of electronic components and a lead terminal member having a number of lead terminals arranged in a row at one side edge of a long connecting member with groups of lead terminals each holding an electronic component body; that is, out of a number of lead terminals on said lead terminal member, groups are formed of a plurality of successive lead terminals in a row and an electronic component body is fixed to each group.

(b) Cutting lead terminals of each group, except at least one selected lead terminal having a respective electronic component body fixed thereto, at a desired position to separate them from the connecting member.

(c) Measuring the electric properties of the respective electronic component bodies between the lead terminal still attached to the connecting member and the lead terminals separated from the connecting member.

(d) Cutting from the electronic component set a number of electronic components each having a plurality of lead terminals by cutting those lead terminals still attached to the connecting member at the same position as the other lead terminals were cut to separate the components from the long connecting member.

(e) Securing respective electronic components to a tape at a desired pitch by fixing to a long tape the plurality of lead terminals of each component.

(f) Cutting at a desired position a plurality of lead terminals of respective electronic components, except for certain terminals, for separating said plurality of terminals from the tape.

According to the manufacturing method of the present invention, it is only the lead terminals still attached to the connecting member that require cutting in the step immediately after measurement of the electrical properties of the electronic component body. In addition, all the lead terminals of each component are fixed to the tape and thereafter certain lead terminals are cut to be separated from the tape to thereby obtain the shorter lead terminals. Thus, even when an electric component body is shifted with the electronic component set, that shift does not cause any problem.

DETAILED DESCRIPTION OF THE INVENTION

Figure 1:
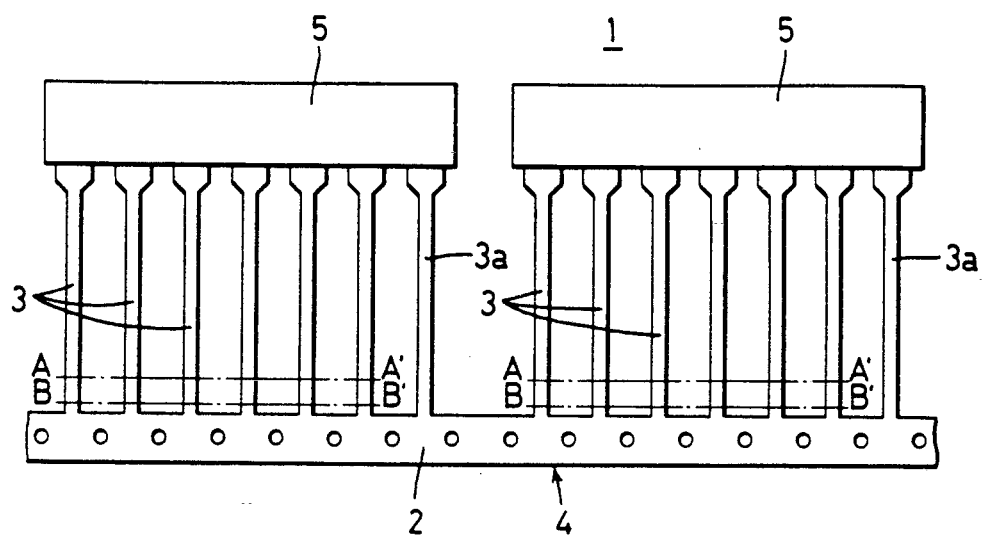
FIGS. 1-5 are explanatory views showing steps in the method of manufacturing components according to the present invention in the order of carrying out the steps.

Examples of the method of manufacturing a tape of electronic components according to the present invention are hereinafter explained in detail referring to the drawings.

First, electronic component set 1 is prepared as shown in FIG. 1. The set 1 is constituted by a number of electronic component bodies 5 fixed to lead terminal member 4 in turn constituted by a row of a plurality of lead terminals 3 provided integrally along one side edge of a long connecting member 2 made of a metal plate in the direction of the length thereof.

On lead terminal member 4 are formed several groups of lead terminals 3 each comprising a plurality of successive lead terminals 3 and an electronic component body 5 is mounted on each group of lead terminals. The body 5 can be, for example, a hybrid integrated circuit, an R network and the like having an insulating substrate with, for example, a wiring pattern thereon, and after being fixed to lead terminals 3, an insulation coating may be applied thereto if necessary.

Figure 2:
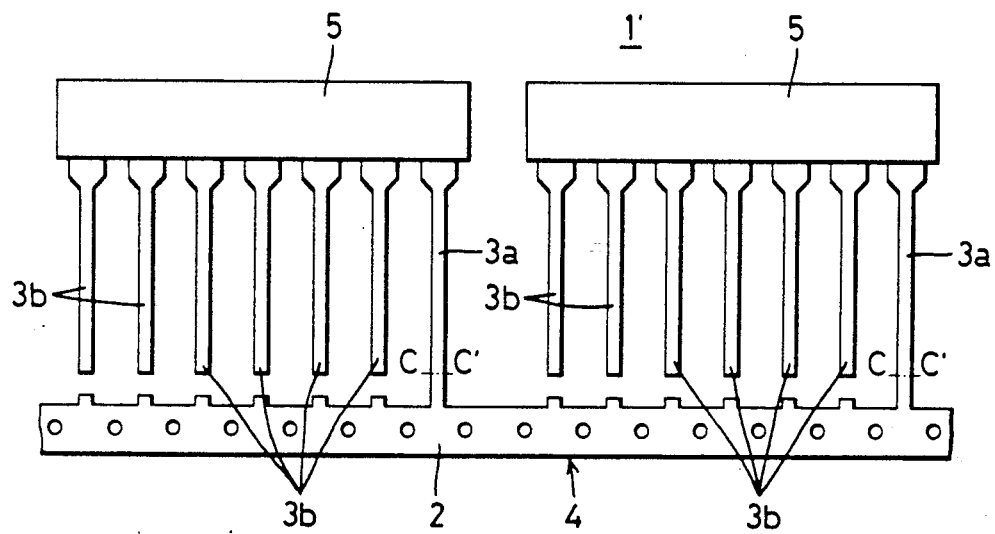

Next, in the electronic component set 1 constituted as described above, the lead terminals 3 for each respective electronic component body 5 other than at least one designated lead terminal 3a are cut (one terminal is shown in the drawing, but a plurality of terminals can be left uncut) at desired positions, for example, along dotted lines A—A' and B—B' near connecting member 2 to seaparate the lead terminals 3 from connecting member 2 to form an electronic component set 1' as shown in FIG. 2 in which each electronic component 5 has a plurality of lead terminals 3b separated from connecting member 2 and at least one designed lead terminal 3a still attached thereto. Lead terminal 3a still attached to connecting member 2 extends from, for example, a common lead of the wiring pattern of the electronic component.

Then, in the electronic component set 1', the electrical properties of electronic component bodies 5 are measured between lead terminal 3a still attached to connecting member 2 and respective lead terminals 3b separated therefrom. The steps described up to now are the same as in the conventional method described hereinbefore.

Figure 3:
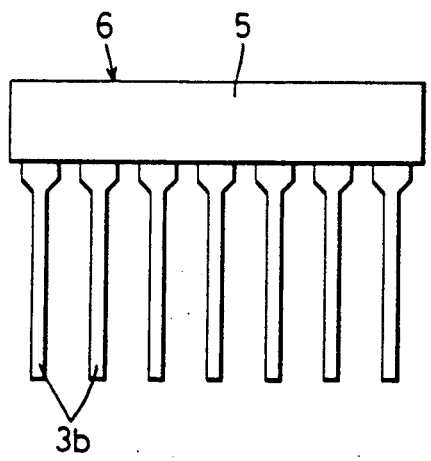

Next, designated lead terminals 3a still attached to connecting member 2 as shown in FIG. 2 are cut at the position of dotted line C—C' near connecting member 2, at substantially the same position as dotted line A—A' in FIG. 1, whereby there is produced a number of semi-finished electronic components 6 separate from connecting member 2 and each having a plurality of lead terminals 3b of substantially the same length, as shown in FIG. 3.

In this step, lead terminal 3a need not be cut at dotted line C—C', but may be cut at other positions. However, in cutting lead terminal 3a, other lead terminals 3b already separated from connecting member 2 should likewise be cut simultaneously to the same length as lead terminal 3a.

It is important in this step, however, to make the respective lead terminals at least slightly longer than the length of the longest terminal of the finished electronic component 6', described hereinafter, in order to meet the requirements for the steps to follow.

Figure 4:
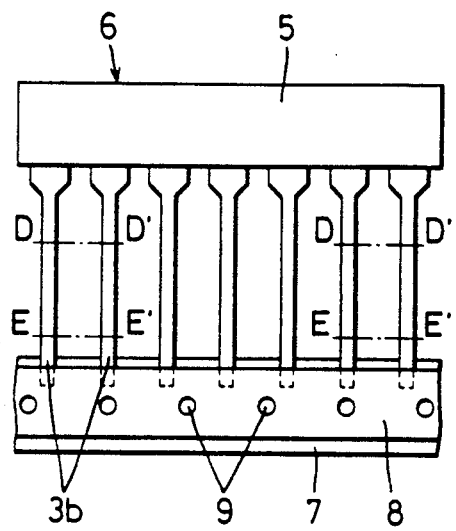

As shown in FIG. 4, the semi-finished electronic components 6 are secured to a long tape 7 at a desired pitch by fixing all of the lead terminals 3b of each component 6 to said tape by an adhesive tape 8 applied over the ends of the leads. Lead terminals 3b may be fixed to tape 7 without using the adhesive tape 8, by inserting lead terminals 3b into perforations formed in the tape 7. Numeral 9 designates perforations formed in tape 7 and adhesive tape 8 on the pitch for engagement by pins on a driving wheel or the like.

Figure 5:
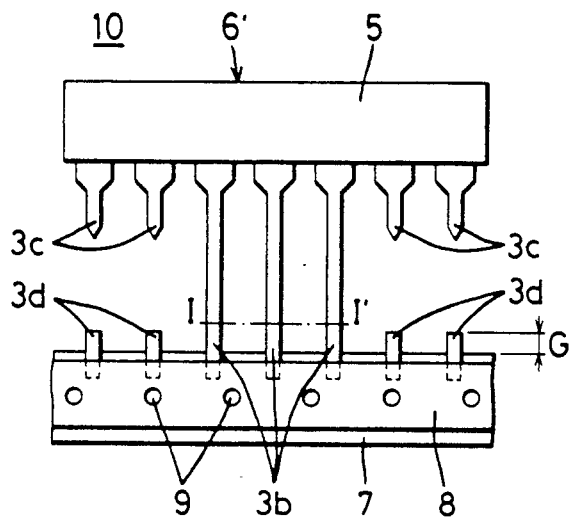
Figure 6:
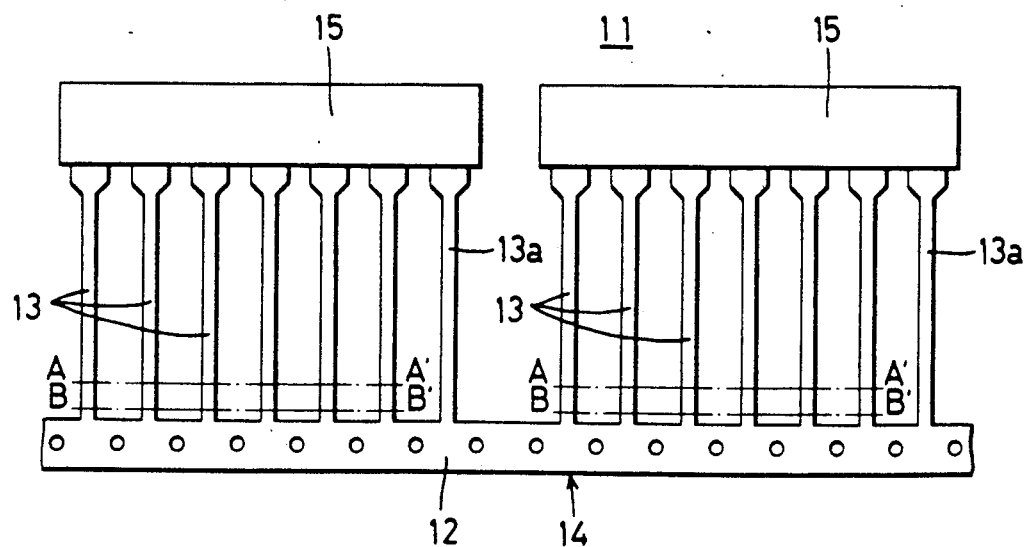
FIGS. 6-9 are explanatory views showing steps in the method of manufacturing a conventional tape of electronic components in the order of carrying out the steps.
Figure 7:
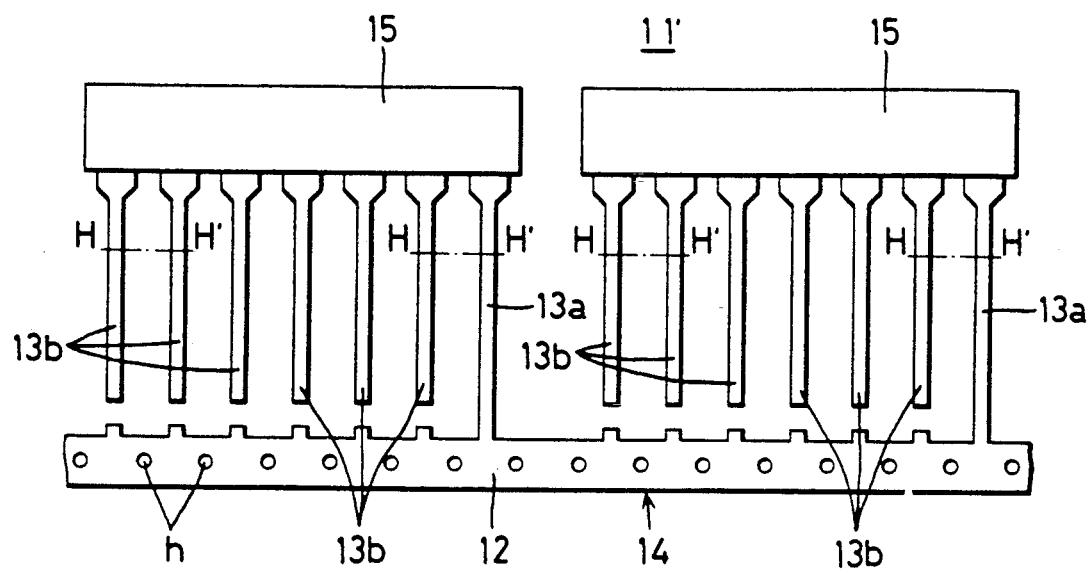
Figure 8:
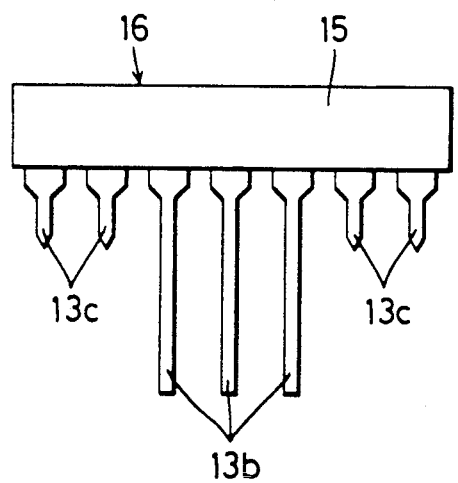
Figure 9:
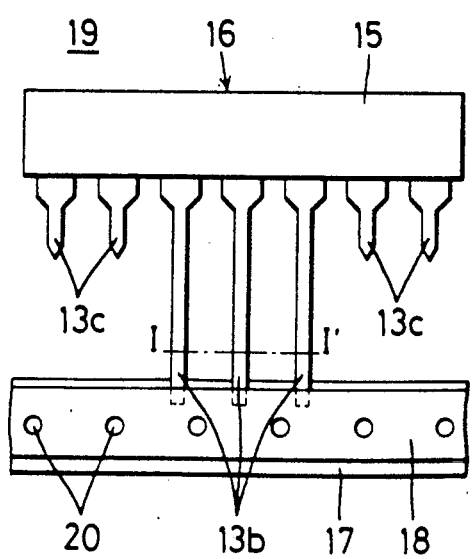

Then some of the lead terminals 3b of respective semi-finished electronic components 6 are cut along dotted lines D—D' near electronic component body 5 and E—E' near tape 7 to separate them from tape 7 and to produce short lead terminals 3c', while leaving some of the lead terminals 3b uncut so as to leave the component body 5 attached to the tape 7 by the uncut leads 3b, thus forming a tape 10 of finished electronic components 6' as shown in FIG. 5. Cutting lead terminals along line D—D' can be conducted in such a way that the lead terminals have pointed ends as shown, for example, in FIG. 5.

Respective finished electronic components 6' on the tape 10 of electronic components thus obtained are thereby provided with long lead terminals 3b and shorter ones 3c, as is conventional. However, because the cutting of the short lead terminals 3c is not done until all the long lead terminals 3b of the semi-finished component 6 are secured to the tape 7, there is no possibility of their being cut to the wrong length or different lengths because of the component body being shifted from its normal position relative to the connecting member 2, as in the prior art.

The tape of electronic components 6' manufactured by the above-described process is fed into an automatic insertion machine by engaging feed pins with perforations 9 of tape 7 and adhesive tape 8 in a conventional way. Then lead terminals 3b fixed to tape 7 are out along dotted line I—I' near tape 7 in FIG. 4, whereby electronic component 6' is separated from tape 7. The electronic component 6' thus separated is fixed to a printed-wiring substrate by the automatic insertion machine in the conventional way. As with lead terminals 3c', lead terminals 3b can be given pointed ends.

In the method of manufacturing tape of electronic components described in the above-described examples of the present invention, left over lead terminal pieces 3d remain on tape 7 when short lead terminals 3c are formed, which sometimes cause hindrance to smooth insertion of tape 10 of electronic components into the automatic insertion machine. Accordingly, it is preferable for the dimension G, from the upper end of lead terminal piece 3d to tape 7, to be within a range of, for example, 0.5-2.0 mm.

The respective numbers of long and short lead terminals 3b and 3c of finished electronic component 6' obtained by the method of the present invention are not limited to those shown in the examples. Moreover, short lead terminals 3c may be formed between longer lead terminals 3b.

By carrying out the method for manufacturing a tape of electronic components according to the present invention as described above with the steps in the order described, precision in the size of lead terminals can be improved to thereby reduce the rate of manufacturing of inferior electronic components.

What is claimed is:

1. A method of manufacturing a tape of finished electronic components having long and short leads and in which the components project laterally from the tape and are supported on the tape by the long leads of the electronic components, comprising the steps, in the recited order, of:

preparing an electronic component set constituted by a plurality of electronic component bodies, a lead terminal member having an elongated connecting member and a plurality of lead terminals integral therewith and extending laterally from the connecting member and spaced at intervals along the length of the connecting member, said lead terminals being in groups with an electronic component body attached to each group of lead terminals;

cutting the lead terminals other than at least one designated lead terminal in each group at a position to separated the lead terminals the designated lead terminal from said connecting member;

measuring the electrical properties of each of said electronic bodies between the designated lead terminal still attached to said connecting member and the respective lead terminals which have been cut;

cutting the designated lead terminals for separating the electronic component bodies and lead terminals from said connecting member to form semi-finished electronic components, said respective cutting steps being carried out for cutting the lead terminals to a length at least slightly longer than the length of the longest lead terminal of a finished electronic component;

securing the semi-finished electronic components to a tape at desired intervals along said tape by attaching the free ends of the lead terminals of the semi-finished electronic components to the tape; and cutting only some of the lead terminals of the respective semi-finished electronic components between the tape and the electronic component bodies for forming short lead terminals; whereby there is produced finished electronic components having said some short lead terminals, and the finished electronic components are supported along said tape by the lead terminals remaining after the short lead terminals and which, when they are cut to separate the electronic components from the tape, become the long lead terminals of the finished electronic components.

* * * * *